United States Patent
Arai

(10) Patent No.: US 7,710,792 B2
(45) Date of Patent: May 4, 2010

(54) SEMICONDUCTOR DEVICE

(75) Inventor: Minari Arai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 35 days.

(21) Appl. No.: 12/155,171

(22) Filed: May 30, 2008

(65) Prior Publication Data

US 2008/0298138 A1 Dec. 4, 2008

(30) Foreign Application Priority Data

Jun. 1, 2007 (JP) ............................. 2007-146873

(51) Int. Cl.
*G11C 7/10* (2006.01)
(52) U.S. Cl. .................... 365/189.05; 365/193
(58) Field of Classification Search ............ 365/189.05, 365/193, 194
See application file for complete search history.

(56) References Cited

U.S. PATENT DOCUMENTS 6,639,868 B2 * 10/2003 Kim et al. .............. 365/233.12
6,922,367 B2 * 7/2005 Morzano et al. ............ 365/193
7,031,205 B2 * 4/2006 Han et al. .................... 365/193
7,120,067 B2 * 10/2006 Han ....................... 365/189.05

FOREIGN PATENT DOCUMENTS

JP 2000-231787 A 8/2000
JP 2003-151300 A 5/2003

* cited by examiner

*Primary Examiner*—Anh Phung
(74) *Attorney, Agent, or Firm*—Foley & Lardner LLP

(57) ABSTRACT

Disclosed is a semiconductor device comprising: a signal selecting circuit for receiving, at first and second inputs thereof, respectively, a first signal output from a first initial-stage circuit that receives a data strobe signal from a first terminal, which is an input/output terminal, and a second signal output from a second initial-stage circuit that receives a data mask signal from a second terminal, which is an input terminal, and based upon a control signal that is supplied thereto, outputting the first and second signals from first and second outputs or interchanging the first and second signals and outputting the interchanged first and second signals from the second and first outputs; a buffer circuit for receiving an output signal from a third initial-stage circuit that receives a data signal from a data terminal; and a data latch circuit for latching a signal from the buffer circuit. The signal from the first output of the signal selecting circuit is supplied to the data latch circuit as a latch timing signal.

10 Claims, 6 Drawing Sheets

WHEN TSELD IS "L"

WHEN TSELD IS "H"

US 7,710,792 B2

SEMICONDUCTOR DEVICE

REFERENCE TO RELATED APPLICATION

This application is based upon and claims the benefit of the priority of Japanese patent application No. 2007-146873, filed on Jun. 1, 2007, the disclosure of which is incorporated herein in its entirety by reference thereto.

FIELD OF THE INVENTION

This invention relates to a semiconductor device and, more particularly, to a semiconductor device having a configuration ideal for measuring AC characteristics such as setup and hold characteristics.

BACKGROUND OF THE INVENTION

In a semiconductor storage device that has an IO pin for receiving a strobe signal that decides input/output timing in data input/output, an output signal of an initial-stage circuit of the strobe signal at the IO pin, and an output signal of another initial-stage circuit of a driver pin which is separately provided from the IO pin, are interchanged in a mode setting or test function.

FIG. 6 illustrates an example of a typical configuration of a semiconductor storage device [DDR (Double Data Rate) SDRAM (Synchronous DRAM)] of the related art. As shown in FIG. 6, the device includes:

a plurality (n+1) of initial-stage circuits DI provided in correspondence with input/output terminals DQ0 to DQn, respectively, and comprising receivers (input buffers) having inputs DIN connected to input/output terminal data DQ0 to DQn, respectively, and outputting respective ones of signals IDQT0 to IDQTn from output terminals IDQT upon comparing the data with a reference voltage VREF;

an initial-stage circuit SI provided in correspondence with an input/output terminal DQS and comprising a receiver circuit for receiving a strobe signal DQS at an input DIN and outputting IDQS upon comparing the strobe signal with the reference voltage VREF;

an initial-stage circuit MI provided in correspondence with an input terminal DM and comprising a receiver for receiving a DM signal as an input and outputting IDM upon comparing the input with the reference voltage VREF;

a plurality of latch circuits DLD for receiving respective ones of the signals IDQT0 to IDQTn from the initial-stage circuits DI as inputs, latching these signals in response to IDQS and outputting latch data (DIR0, DIF0), . . . , (DIRn, DIFn); and a latch circuit DLM for outputting latch data (DMR, DMF) that is the result of latching IDM from the initial-stage circuit MI at the timings of rising and falling edges of IDQS. Meanwhile, there is adopted such a notation that R and F provided in a last position or in a position preceding to a last index number of the signal names in data latch circuits indicate signals sampled responsive to rising and falling edges of latch timing signal, respectively.

The data strobe signal (DQS) is a bidirectional strobe signal and functions as a reference clock at the time of data input/output. At the time of a read cycle, edges (rising and falling edges) of DQS coincide with edges of read data. At the time of a write cycle, a controller (not shown) controls the data strobe signal (DQS), which is synchronized to a clock signal and the DDR-SRAM captures the data based upon the data strobe signal (DQS).

Further, DM is a write-mask enable signal that masks input data when it is at the high level. The input/output terminals DQ0 to DQn and DQS are connected to associated IO pins of a semiconductor test equipment (not shown), and the input terminal DM is connected to a driver pin of the semiconductor test equipment.

In a semiconductor test equipment or test board, an IO pin involves more wiring and load for a comparator than a driver pin or an IO pin. By the way, a driver pin of the semiconductor test equipment is usually connected to an input terminal of a device under test (DUT) and an IO driver pin of the semiconductor test equipment is connected to output and input terminals or an IO terminal of the device.

The input waveform of an IO pin having a heavy load has a slope [(amount of change in voltage)/(unit time)] smaller and less steep than that of the input waveform of the driver pin.

Consequently, in case of high speed operation, the amplitude of the input signal supplied to the test board from the semiconductor test equipment is of a level less than that set by a program or the like.

Further, since the slope of the waveform of the input signal supplied to the test board from the semiconductor test equipment is small, the input signal contains a large error referred to as jitter. This becomes more conspicuous in case of high speed operation with a large input amplitude.

Patent Document 1 discloses an arrangement for changing over an internal signal. Specifically, the arrangement suppresses an increase in number of terminals by assigning a mask address signal IDQM as is or a mask address signal obtained by decoding this signal to address signals that accompany a decrease in input/output data terminals when a test mode is in effect. Specifically, a test-mode activation signal is supplied internally as an internal mask decode signal when at the high level. When the test-mode activation signal is at the low level, an internal address mask signal is supplied internally as is as an in-phase signal. Further, Patent Document 2 discloses an arrangement in which buffer means is connected in series between an initial-stage circuit and a latch circuit. However, in Patent Documents 1 and 2, there is not disclosed any arrangement of reducing error in a measurement system for measuring the setup and hold characteristics of data, ascribable to the fact that the IO pin has a blunter waveform than the waveform of the driver pin.

[Patent Document 1] Japanese Patent Kokai Publication No. JP-P2003-151300A

[Patent Document 2] Japanese Patent Kokai Publication No. JP-P2000-231787A

The following analysis is given by the present invention. In a semiconductor test equipment, only a driver controller need be provided for a driver pin. On the other hand, an IO pin involves the inclusion of a driver controller and a comparator controller. Consequently, jitter involving IO pins is generally set larger than jitter involving the driver pin.

Accordingly, the slopes of waveforms of a data signal and data strobe signal from IO pins of the semiconductor test equipment are both small and the amounts of jitter of both signals are large. As a result, a device under test (DUT) cannot capture a data signal received at an IO pin thereof responsive to a data strobe signal received at an IO pin thereof under accurate conditions. A problem which arises, therefore, is that accurate input setup and hold characteristics cannot be measured.

In relation to sampling by a latch circuit of a data signal DQ/write mask-enable signal DM based upon a data strobe signal DQS in a DDR-SDRAM, if it is attempted to capture DQ/DM data at high speed by DQS, which is received at an IO pin, the input signal of DQS will not reach the preset level, as mentioned above. In addition, since there will be a great amount of jitter, the output signal of the initial-stage circuit (receiver circuit) of the corresponding signal also will contain a large amount of jitter.

Similarly, since the data signal DQ sampled also is received at an IO pin, jitter is great and the setup and hold characteristics decided by IO pins for both DQ and DQS signals exhibiting large amounts of jitter are shifted from the correct characteristics.

SUMMARY OF THE DISCLOSURE

By adopting a novel circuit configuration in a semiconductor device, the present invention eliminates, in terms of measurement, a difference between jitter at an IO pin and jitter at a driver pin possessed by a semiconductor test equipment or text board.

A semiconductor device according to one aspect of the present invention comprises: a first terminal which is an input/output terminal; a second terminal which is an input terminal; a signal selecting circuit that receives a first signal supplied to said first terminal and a second signal supplied to said second terminal, and based upon a control signal supplied thereto, outputs from first and second outputs thereof, the first and second signals in straight connection or the second and first signals in cross connection; and a latch circuit that receives the signal from the first output of said signal selector circuit as a latch timing signal. The latch circuit latches data supplied to a third terminal responsive to said latch timing signal. There may be provided a circuit, which is inserted between an output of said third initial-stage circuit and an input of said latch circuit, for delaying the output of said third initial-stage circuit for a period of time corresponding to a delay in said signal selecting circuit.

The meritorious effects of the present invention are summarized as follows.

In accordance with the present invention, capturing of data at an IO pin is performed by a driver pin having little jitter. As a result, measurement of the setup and hold characteristics of a semiconductor device can be performed more accurately.

Still other features and advantages of the present invention will become readily apparent to those skilled in this art from the following detailed description in conjunction with the accompanying drawings wherein examples of the invention are shown and described, simply by way of illustration of the mode contemplated of carrying out this invention. As will be realized, the invention is capable of other and different examples, and its several details are capable of modifications in various obvious respects, all without departing from the invention. Accordingly, the drawing and description are to be regarded as illustrative in nature, and not as restrictive.

PREFERRED MODES OF THE INVENTION

Preferred modes of the invention will be described with reference to the accompanying drawings. The present invention provides a semiconductor device having an input/output terminal for a strobe signal that decides input/output timing in data input/output, the device having a function whereby the output signal from an initial-stage circuit of an input/output terminal (the circuit receives supply of a signal from an IO pin of a semiconductor test equipment at the time of a test) and the output signal from an initial-stage circuit of a separate input terminal (the circuit receives supply of a signal from a driver pin of the semiconductor test equipment at the time of a test) can be interchanged in a mode setting or test function. By interchanging the signals, capturing of data from an IO pin of the semiconductor test equipment is performed by the small-jitter driver pin of the semiconductor test equipment. As a result, measurement of the setup and hold characteristics of inputs if a device under test can be performed more accurately in comparison with measurement performed conventionally. More specifically, a semiconductor device according to the present invention includes:

a signal selecting circuit (SEL) that receives at first and second inputs (IDQS and IDM), respectively, a signal that is output from a first initial-stage circuit (SI) connected to a first terminal (DQS) which is an input/output terminal, and a signal that is output from a second initial-stage circuit (MI) connected to a second terminal (DM) which is an input terminal, and responsive to a control signal (TSELD), outputs the signals received at the first and second inputs (IDQS and IDM) from first and second outputs (DQSI and DMI) in straight connection, or interchanging the signals received at the first and second inputs and outputting the signals from the second and first outputs in cross connection;

a latch circuit (DLD) which receives the first output (DQSI) of said signal selector circuit (SEL) as a latch timing signal; and a circuit (BF), which is inserted between an output of a third initial-stage circuit (DI) connected to a third terminal (DQ) that is an input/output terminal or an input terminal, and an input (BD) of said latch circuit, for delaying the output of the third initial-stage circuit (DI) for a period of time corresponding to a delay in said signal selecting circuit (SEL). In case of the setup and hold characteristics of the device being tested, a signal from an IO pin of a semiconductor test equipment is supplied to the first terminal (DQS), a signal from a driver pin of the semiconductor test equipment is supplied to the second terminal (DM), and on the basis of the control signal (TSELD), the signal selecting circuit (SEL) interchanges the signals received at the first and second inputs (IDQS and IDM) and outputs the interchanged signals from the second and first outputs.

Figure 1:
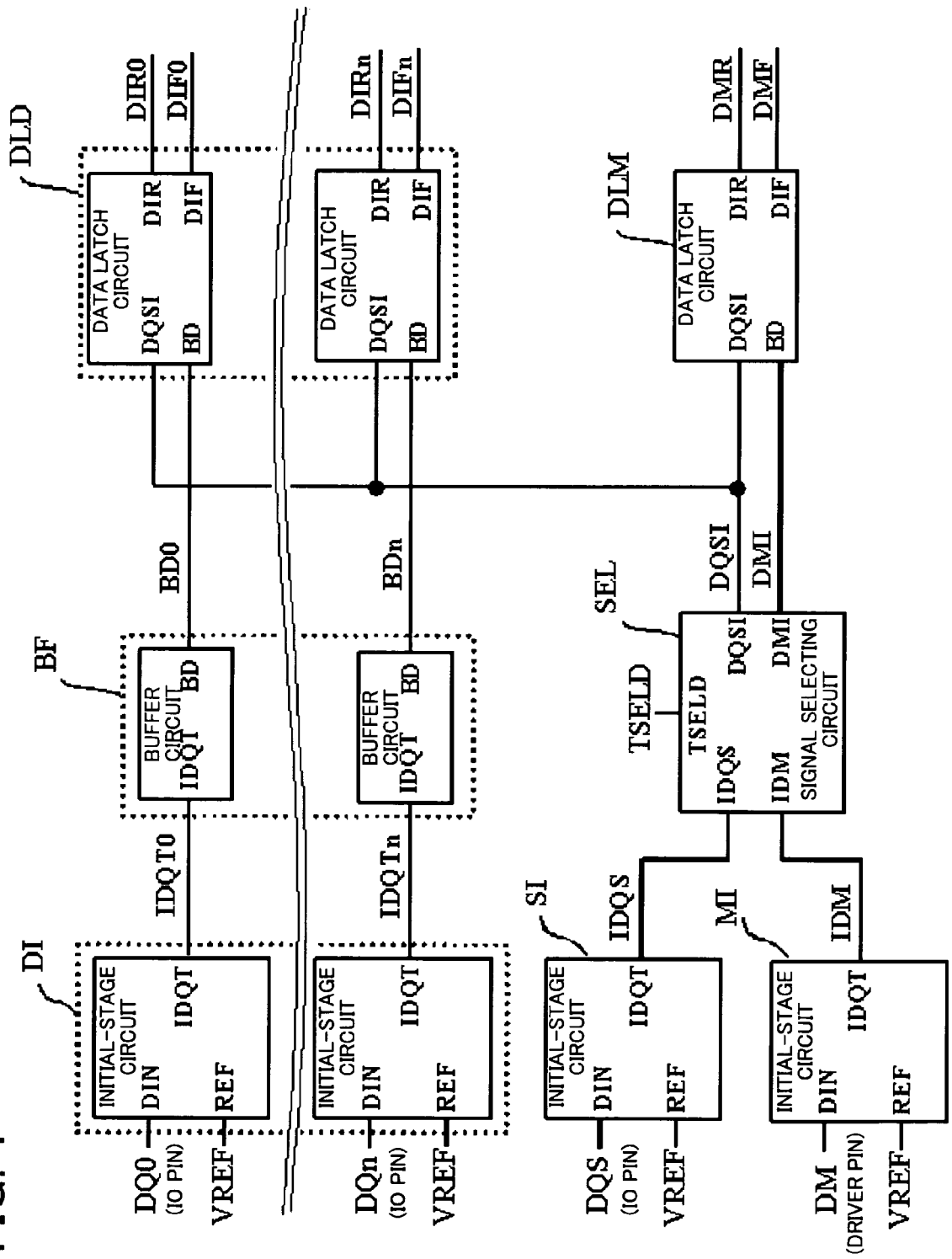
FIG. 1 is a diagram illustrating the configuration of an exemplary embodiment of the present invention.

FIG. 1 is a diagram illustrating the configuration of a semiconductor device according to an example of the present invention. As illustrated in FIG. 1, this example has a signal selecting circuit for selecting output signals of initial-stage circuits of DQS and DM.

The semiconductor device comprises:

a plurality (n+1) of initial-stage circuits DI provided in correspondence with input/output terminals DQ0 to DQn and comprising receivers (input buffers) having inputs DIN connected to input/output terminal DQ0 to DQn and outputting respective ones of signals IDQT0 to IDQTn from output terminals IDQT upon comparing the data with a reference voltage VREF;

an initial-stage circuit SI provided in correspondence with an input/output terminal DQS and comprising a receiver circuit for receiving a data strobe signal DQS at an input DIN and outputting a signal IDQS upon comparing the data strobe signal with the reference voltage VREF;

an initial-stage circuit MI provided in correspondence with an input terminal DM and comprising a receiver for receiving a DM signal as an input and outputting IDM upon comparing the input with the reference voltage VREF;

a plurality (n+1) of buffer circuits BF which receive respective ones of the signals IDQT0 to IDQTn from the initial-stage circuits DI;

a signal selecting circuit SEL for receiving IDQS and IDM from the initial-stage circuits SI and MI, respectively, as inputs and, based upon a control signal TSELD, outputting the two input signals from first and second outputs in straight connection or in cross connection;

a plurality of latch circuits DLD for receiving respective ones of output signals BD0 to BDn of the buffer circuits BF as inputs, latching these signals in response to DQSI, which is output from the signal selecting circuit SEL, and outputting latch data (DIR0, DIF0), ... (DIRn, DIFn) at timings of rising and falling edges of DQSI; and a latch circuit DLM for outputting latch data (DMR, DMF) that is the result of latching DMI from the signal selecting circuit SEL at the timings of rising and falling edges of DQSI.

The input/output terminals DQ0 to DQn, DQS are connected to IO pins of the semiconductor test equipment (not shown), and the input terminal DM is connected to the driver pin of the semiconductor test equipment.

Each buffer circuit BF has a delay equivalent to that of the signal selecting circuit SEL.

The signal selecting circuit SEL interchanges and outputs its two input signals in accordance with the control signal TSELD.

Figure 2:
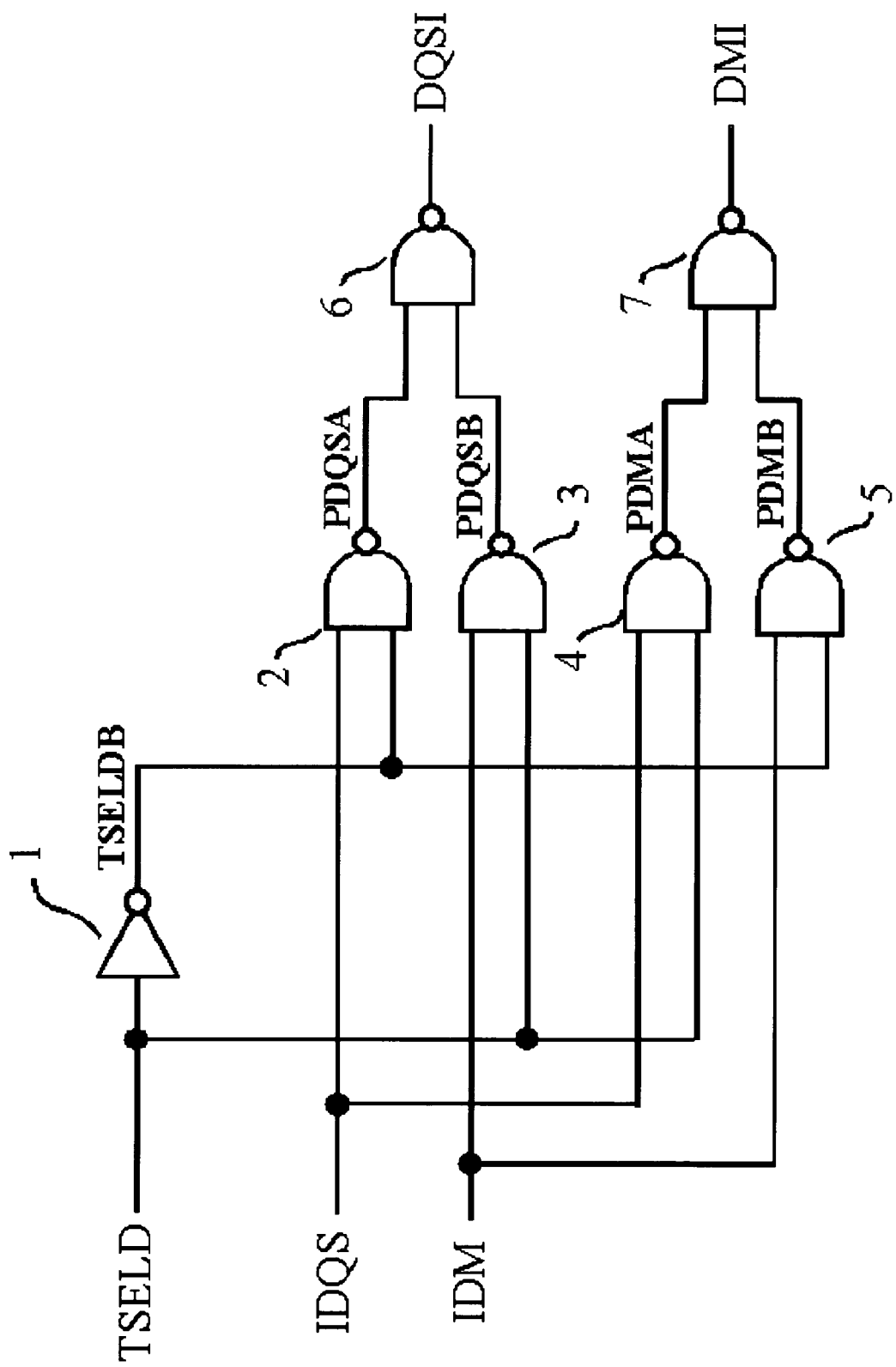
FIG. 2 is a diagram illustrating the configuration of a signal selecting circuit according to the exemplary embodiment.

FIG. 2 is a diagram illustrating an example of the configuration of the signal selecting circuit SEL in FIG. 1. As shown in FIG. 2, the signal selecting circuit SEL comprises:

an inverter 1 for receiving the TSELD signal as an input and outputting a signal, which is obtained by inverting the TSELD signal, as a TSELDB signal;

a 2-input NAND gate 2 for receiving the IDQS signal and TSELDB signal as inputs and outputting the NAND between the two inputs as a PDQSA signal;

a 2-input NAND gate 3 for receiving the IDM signal and TSELD signal as inputs and outputting the NAND between the two inputs as a PDQSB signal;

a 2-input NAND gate 4 for receiving the IDQS signal and TSELD signal as inputs and outputting the NAND between the two inputs as a PDMA signal;

a 2-input NAND gate 5 for receiving the IDM signal and TSELDB signal as inputs and outputting the NAND between the two inputs as a PDMB signal;

a 2-input NAND gate 6 for receiving the PDQSA signal and PDQSB signal as inputs and outputting the NAND between the two inputs as a DQSI signal; and a 2-input NAND gate 7 for receiving the PDMA signal and PDMB signal as inputs and outputting the NAND between the two inputs as a DMI signal.

When the TSELD signal is at the low level, TSELDB is high, the output PDQSA of NAND gate 2 is a value obtained by inverting IDQS, the output PDQSB of NAND gate 3 is high and NAND gate 6 outputs a signal obtained by inverting the output PDQSA of NAND gate 2, namely IDQS. The output PDMB of NAND gate 5 is a value obtained by inverting IDM, the output PDMA of NAND gate 4 is high and NAND gate 7 outputs a signal obtained by inverting the output PDMB of NAND gate 5, namely IDM. That is, IDQS, IDM are output from DQSI, DMI, respectively.

When the TSELD signal is at the high level, TSELDB is low, the output PDQSA of NAND gate 2 is high, the output PDQSB of NAND 3 is a signal obtained by inverting IDM, and NAND gate 6 outputs a signal obtained by inverting the output PDQSB of NAND gate 3, namely IDM. The output PDMB of NAND gate 5 is high, the output PDMA of NAND gate 4 is a value obtained by inverting IDQS, and the NAND gate 7 outputs a signal obtained by inverting the output PDMA of NAND gate 4, namely IDQS. That is, IDM, IDQS are output from DQSI, DMI, respectively.

In this example, the signal selecting circuit SEL selects one of the signals IDQS and IDM, which are output from the initial-stage circuits SI and MI, respectively, as the DQSI signal which serves as the trigger clock for loading data by DQn, which is at the IO pin, and by the data latch circuits DLD and DLM. Although no restriction is imposed on the present invention, the TSELD signal is set the low or high level by an externally applied command.

If TSELD is low, the IDQS signal is output as DQSI following a delay equivalent to that of the two 2-input NAND gates, and the IDM signal is output as DMI following a delay equivalent to that of the two 2-input NAND gate. That is, a signal produced from the external DQS signal serves as the latching trigger clock (latch timing signal) of the data latch circuits.

Figure 6:
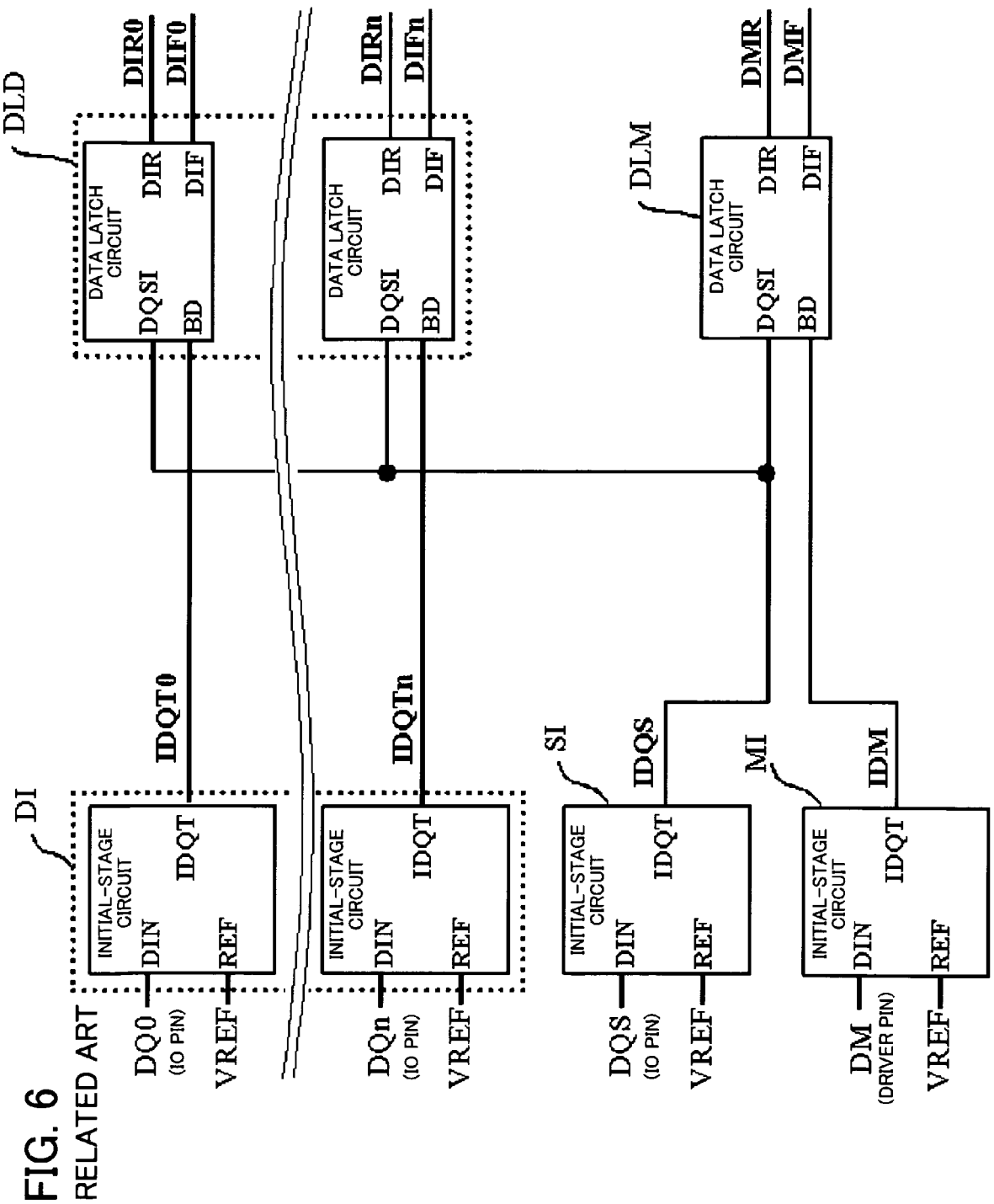
FIG. 6 is a diagram illustrating the configuration of a semiconductor storage device according to the related art.

This is the same as a state in which time of arrival up to the latch circuits in FIG. 6 is delayed by the amount of delay imposed by the two 2-input NAND gates, and therefore the setup and hold characteristics of the data are no different from those of the related art.

If TSELD is high, on the other hand, the TSELD signal in FIG. 2 is low. Accordingly, the IDM signal is output as DQSI following a delay equivalent to that of the two 2-input NAND gates, and the IDQS signal is output as DMI following a delay equivalent to that of the two 2-input NAND gates. That is, a signal produced from the external DM signal serves as the latching trigger clock of the data latch circuits.

The buffer circuit BF in FIG. 1 is provided in order to furnish the side on which the data is latched with a delay equivalent to that of the two 2-input NAND gates in the signal selecting circuit SEL.

Figure 3:
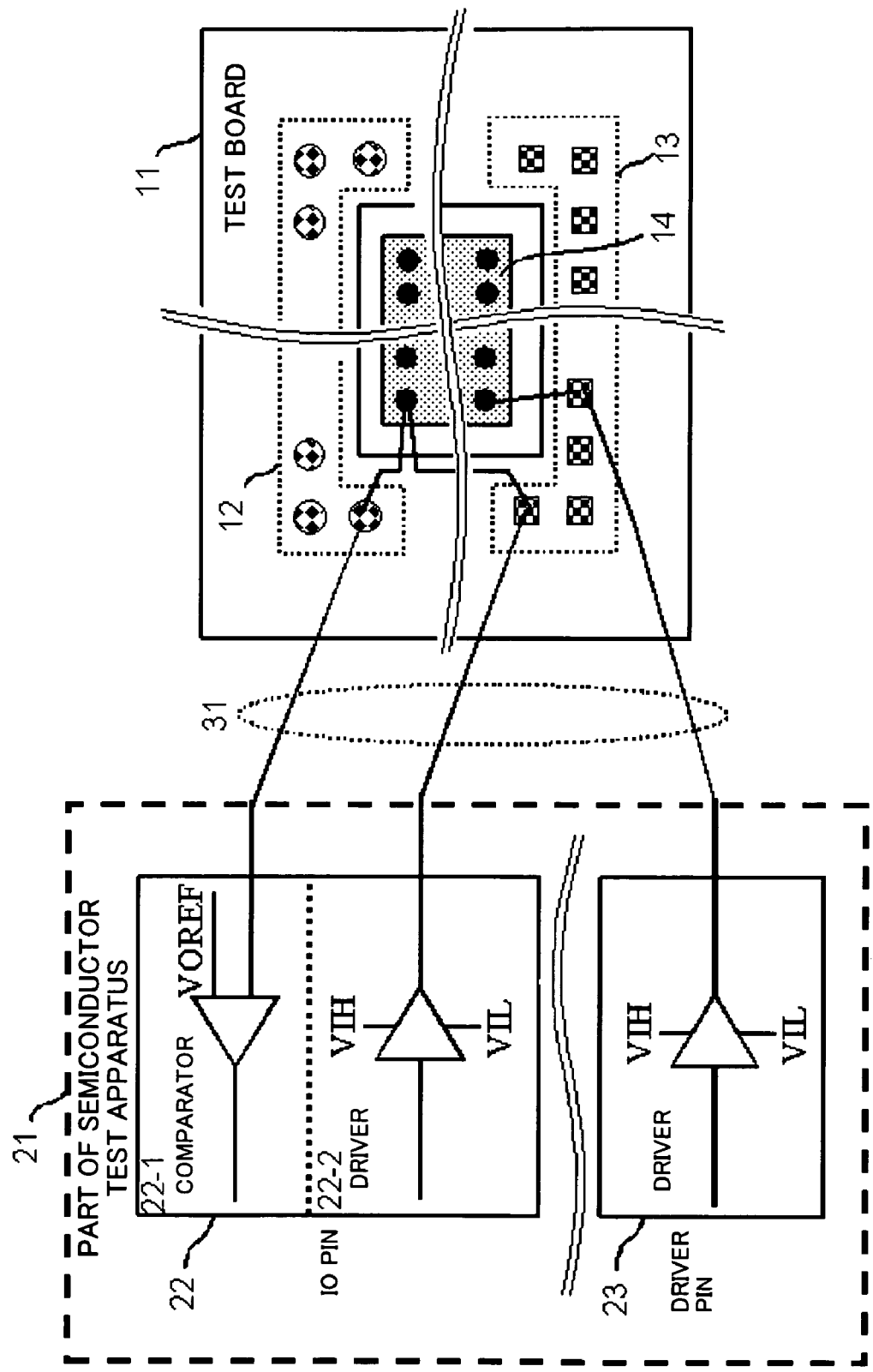
FIG. 3 is a diagram illustrating the manner in which a semiconductor test equipment (input/output portions of an IO pin and output portion of a driver pin) and a test board are connected.

FIG. 3 is a diagram illustrating an example of the connection between a semiconductor test equipment 21 and a test board 11. Only the input/output portions of an IO pin and output portion of a driver pin are shown.

The test board 11 includes an output group 12 to be connected to a comparator 22-1 of the semiconductor test equipment 21 via wires 31; an input group 13 to be connected to a driver 22-2 of the semiconductor test equipment 21 via the wires 31; and a socket 14 in which a DUT (not shown) is inserted.

The semiconductor test equipment 21 includes an IO pin 22 having the comparator 22-1 and driver 22-2, and a driver pin 23 having only a driver.

The IO pin 22 is electrically connected to one member of the output group 12 and to one member of the input group 13 of test board 11, and the driver pin 23 is electrically connected to one member of the input group 13.

As illustrated in FIG. 3, the IO pin 22 has more board wiring and wires 31 than the driver pin 23 and therefore has a heavier load than the driver pin 23. If it is desired to obtain a large amplitude as an input at a high speed, a shift to the operation described next may be made owing to this load before the waveform at the socket 14 reaches the prescribed level.

Figure 4:
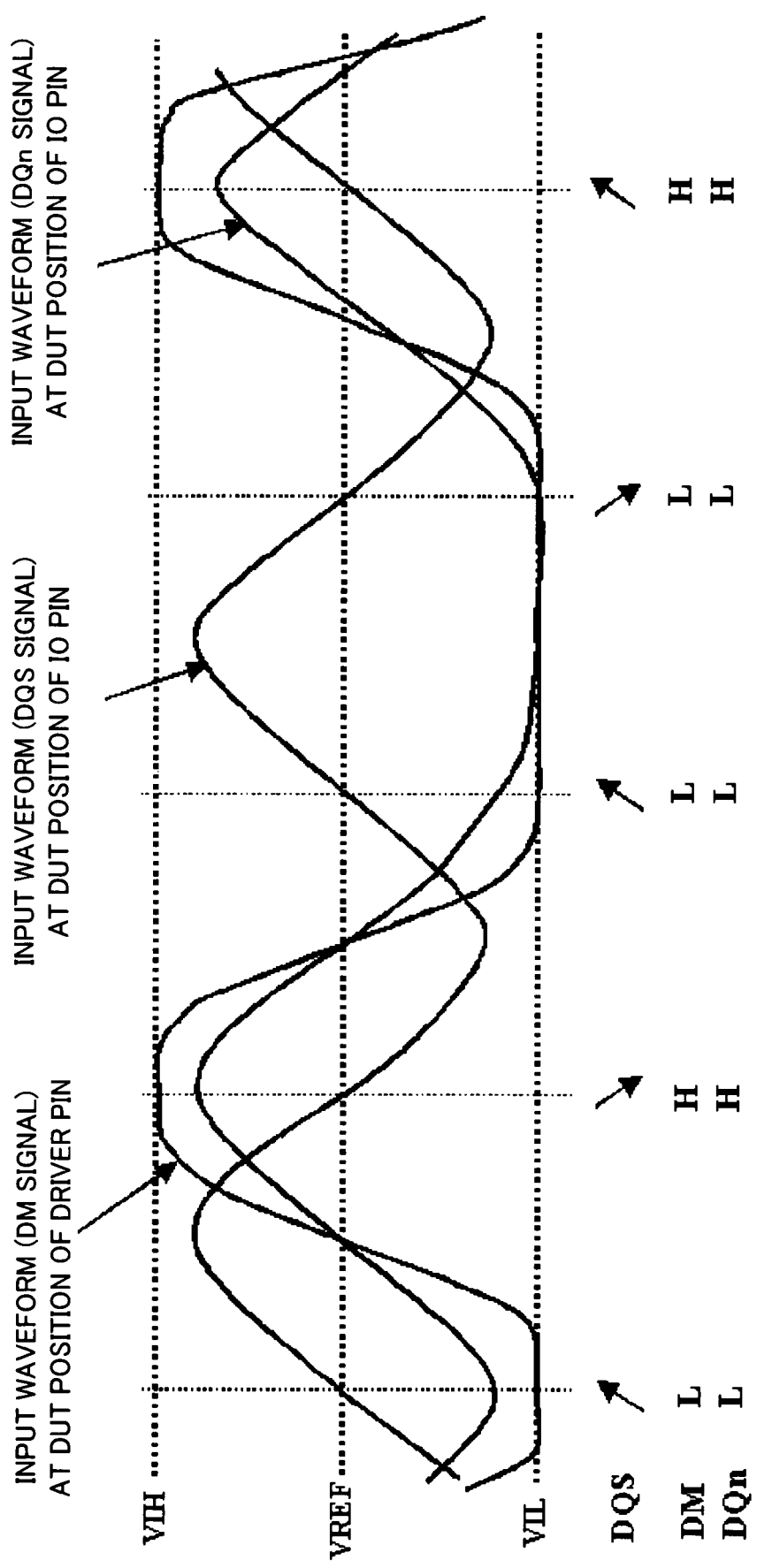
FIG. 4 is a diagram illustrating input waveforms at DUT positions of an IO pin and driver pin at the time of high-speed operation.

FIG. 4 illustrates an example of waveforms in this case. Specifically, FIG. 4 shows examples of waveforms of the DM signal at the driver pin and of the DQS and DQn signals at the IO pins. In a case where the difference between VIH, which is the high level, and VIL, which is the low level, has been set to be large at the time of high-speed operation, the large-load DQS and DQn signals at the IO pins cannot reach the prescribed levels, namely VIH, which is the high level, and VIL, which is the low level, and the slopes [(change in voltage)/(unit time)] of the waveforms also are small in comparison with the slope of the waveform of the DM pin. The fact that the slopes are small leads to deterioration of the characteristics of the initial-stage circuits, namely an increase in fluctuation (jitter) of the output signals from the initial-stage circuits.

Further, generally the vender of the semiconductor test equipment provides the information regarding the amount of waveform fluctuation, referred to as jitter, with respect to signals sent from the semiconductor test equipment.

Jitter at a driver pin differs from jitter at an IO pin. Often the design is such that the value of jitter at the IO pin is larger.

The output waveform of the initial-stage circuit of the IO pin differs from the waveform of the driver pin and possess a large amount of jitter.

By way of example, in a DDR-SDRAM that operates at a double data rate, the signal DQS that strobes the data at the IO pin is an IO pin and is the signal for latching the data DQn signal at the IO pin. Therefore, the setup and hold characteristics of data are parameters decided by the two IO pins. This means that jitter appears substantially as double the jitter of the IO pin. The result is that the setup and hold characteristics of data differ from the actual characteristics (this is one of the problems of the related art).

Accordingly, the present invention, in order to diminish this phenomenon, uses the signal selecting circuit SEL of FIG. 2 to interchange the output signal of the initial-stage circuit of the IO pin DQS, which is the data latching signal, and the output signal of the initial-stage circuit of DM, which is the driver pin. As a result, the output signal of the initial-stage circuit of DM, which is the driver pin, becomes the trigger signal. This is the signal that causes the output signals of the initial-stage circuits of DQS, DQn, which are IO pins, to be captured.

As a consequence, jitter at an IO pin appears only in the signal on the side on which DQn is latched, and therefore the difference between jitter at the IO pin and jitter at the driver pin without the interchange can be reduced.

Figure 5A:
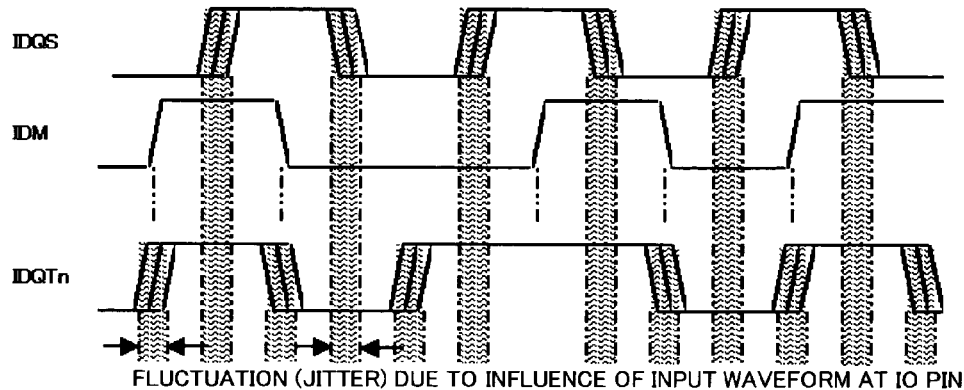
FIGS. 5A to 5C are timing waveforms illustrating operation according to the exemplary embodiment.
Figure 5B:
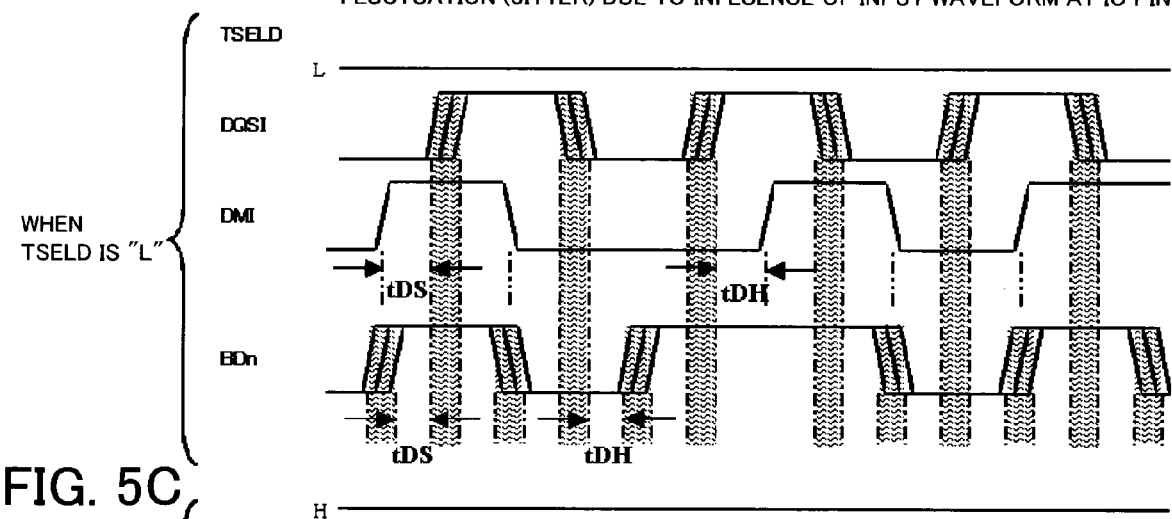
Figure 5C:
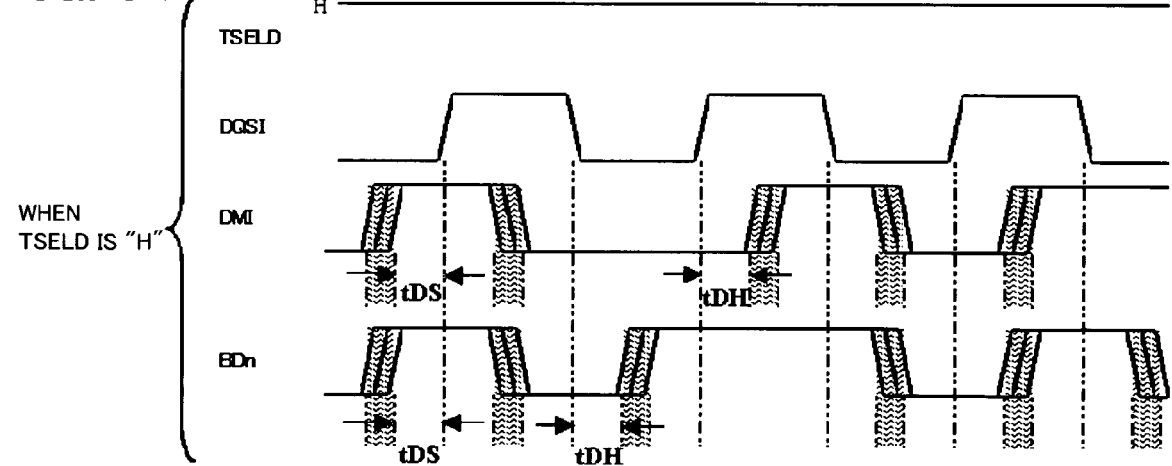

FIGS. 5A to 5C are diagrams illustrating operation waveforms associated with FIG. 1. FIG. 5A is a diagram useful in describing jitter due to the influence of the input waveform at an IO pin. This diagram illustrates jitter in the output IDQS of the initial-stage circuit of DQS, and jitter in the output IDQT of the initial-stage circuit of DQ at an IO pin.

FIG. 5B is a diagram useful in describing setup time tDS and hold time tDH in the data latch circuit DLD when TSELD is at the low level. When TSELD is at the low level, IDQS is used as DQSI and therefore DQSI is influenced by jitter in the trigger clock.

FIG. 5C is a diagram useful in describing setup time tDS and hold time tDH in the data latch circuit DLD when TSELD is at the high level. When TSELD is at the high level, IDM (the signal from the driver pin of the tester) is used as DQSI and hence there is little jitter.

The effects of this example will now be described.

It is possible to reduce error, in a measurement system for measuring the setup and hold characteristics of data, ascribable to the fact that an IO pin has a blunter input waveform than the input waveform of a driver pin and involves a great amount of jitter. This makes it possible to measure the setup and hold characteristics of data more accurately. In the above mentioned example, this is achieved by providing the signal selecting circuit SEL and the buffer circuit BF and setting the control signal TSELD, which is supplied to the signal selecting circuit SEL, to the high level by an external command or the like, thereby changing over the latch timing signal of the latch circuit to a signal produced from the DM signal, which is the signal at the driver pin.

Though the present invention has been described in accordance with the foregoing examples, the invention is not limited to these examples and it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device comprising:
   a first terminal which is an input/output terminal;
   a second terminal which is an input terminal;
   a signal selecting circuit including first and second inputs for receiving first and second signals supplied to said first and second terminals, respectively; said signal selecting circuit outputting, from first and second outputs thereof, said first and second signals received at said first and second inputs, in straight connection or in cross connection, based upon a control signal supplied thereto; and
   a latch circuit that receives the signal output from said first output of said signal selecting circuit as a latch timing signal.

2. The semiconductor device according to claim 1, further comprising a third terminal which is an input/output terminal or an input terminal;
   wherein said latch circuit latches data supplied to said third terminal responsive to said latch timing signal.

3. The device according to claim 1, further including a synchronous semiconductor storage device.

4. The semiconductor device according to claim 1, further comprising a third terminal which is an input/output terminal or an input terminal;
   wherein said latch circuit latches data supplied to said third terminal responsive to said latch timing signal.

5. A semiconductor device comprising:
   a first terminal which is an input/output terminal;
   a second terminal which is an input terminal;
   a signal selecting circuit including first and second inputs for receiving first and second signals supplied to said first and second terminals, respectively; said signal selecting circuit outputting, from first and second outputs thereof, said first and second signals received at said first and second inputs, in straight connection or in cross connection, based upon a control signal supplied thereto;

a latch circuit that receives the signal output from said first output of said signal selecting circuit as a latch timing signal;

a first initial-stage circuit which is connected to said first terminal;

a second initial-stage circuit which is connected to said second terminal;

said signal selecting circuit receiving, at said first and second inputs, said first and second signals output from said first and second initial-stage circuits, respectively; said signal selecting circuit, based upon said control signal, outputting said first and second signals received at said first and second inputs from said first and second outputs, respectively, or interchanging said first and second signals received at said first and second inputs and outputting said second and first signals from said first and second outputs, respectively;

a third terminal which is an input/output terminal or an input terminal;

a third initial-stage circuit which is connected to said third terminal; and a circuit, which is inserted between an output of said third initial-stage circuit and an input of said latch circuit, for delaying the output of said third initial-stage circuit for a period of time corresponding to a delay in said signal selecting circuit.

6. The device according to claim 5, wherein each initial-stage circuit is a receiver circuit.

7. The semiconductor device according to claim 5, wherein said latch circuit latches data supplied to said third terminal responsive to said latch timing signal.

8. A semiconductor device comprising:

a first terminal which is an input/output terminal;

a second terminal which is an input terminal;

a signal selecting circuit including first and second inputs for receiving first and second signals supplied to said first and second terminals, respectively; said signal selecting circuit outputting, from first and second outputs thereof, said first and second signals received at said first and second inputs, in straight connection or in cross connection, based upon a control signal supplied thereto; and a latch circuit that receives the signal output from said first output of said signal selecting circuit as a latch timing signal, wherein said first signal is a data strobe signal that is used for deciding input/output timing in data input/output; and said second signal is a data mask signal that is used for masking input data;

wherein, when setup and hold characteristics are tested, said latch circuit latches data using as the latch timing signal said data mask signal which said signal selecting circuit based on said control signal outputs from said first output.

9. A semiconductor device comprising:

a signal selecting circuit including first and second inputs for receiving respectively, a first signal output from a first initial-stage circuit that receives a data strobe signal from a first terminal, which is an input/output terminal, and a second signal output from a second initial-stage circuit that receives a data mask signal from a second terminal, which is an input terminal; said signal selecting circuit, based upon a control signal supplied thereto, outputting said first and second signals from first and second outputs thereof or interchanging said first and second signals and outputting said first and second signals from said second and first outputs thereof;

a buffer circuit receiving an output signal from a third initial-stage circuit that receives a data signal from a data terminal, which is an input/output terminal; and a data latch circuit latching a signal from said buffer circuit;

wherein the signal from the first output of said signal selecting circuit is supplied to said data latch circuit as a latch timing signal.

10. The semiconductor device according to claim 1, wherein a signal from an IO pin of a semiconductor test equipment is supplied to said first terminal when a test is conducted;

a signal from a driver pin of the semiconductor test equipment is supplied to said second terminal when a test is conducted; and on the basis of said control signal, said signal selecting circuit interchanges said first and second signals received at the first and second inputs to output said first and second signals from the second and first outputs when setup and hold characteristics are tested.

* * * * *